(12) United States Patent
Lee et al.

(10) Patent No.: US 10,361,239 B2
(45) Date of Patent: Jul. 23, 2019

(54) IMAGE SENSOR

(71) Applicant: Samsung Electronics Co., Ltd., Suwon-si, Gyeonggi-do (KR)

(72) Inventors: Kwang-Min Lee, Seoul (KR); GwideokRyan Lee, Suwon-si (KR); Seokjin Kwon, Seoul (KR); Beomsuk Lee, Yongin-si (KR); Taeyon Lee, Seoul (KR); Dongmo Im, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 9 days.

(21) Appl. No.: 15/696,132

(22) Filed: Sep. 5, 2017

(65) Prior Publication Data
US 2018/0204874 A1 Jul. 19, 2018

(30) Foreign Application Priority Data
Jan. 16, 2017 (KR) .......... 10-2017-0007167

(51) Int. Cl.
*H01L 27/146* (2006.01)
*H04N 9/04* (2006.01)
*H04N 9/07* (2006.01)

(52) U.S. Cl.
CPC .... *H01L 27/14645* (2013.01); *H01L 27/1461* (2013.01); *H01L 27/14605* (2013.01); *H01L 27/14621* (2013.01); *H01L 27/14623* (2013.01); *H01L 27/14636* (2013.01); *H04N 9/045* (2013.01); *H04N 9/07* (2013.01); *H04N 2209/042* (2013.01)

(58) Field of Classification Search
CPC ......... H01L 27/14621; H01L 27/14623; H01L 27/14605; H01L 27/14636
See application file for complete search history.

(56) References Cited

U.S. PATENT DOCUMENTS

| | | | |
|---|---|---|---|
| 9,281,486 B2 | 3/2016 | Takimoto et al. |
| 9,293,722 B2 | 3/2016 | Miyanami |
| 9,300,891 B2 | 3/2016 | Isono et al. |
| 9,401,388 B2 | 7/2016 | Sato |
| 9,412,776 B2 | 8/2016 | Kawashima et al. |
| 2012/0326257 A1 | 12/2012 | Takata |
| 2014/0353651 A1 | 12/2014 | Takimoto et al. |

(Continued)

*Primary Examiner* — David C Spalla
(74) *Attorney, Agent, or Firm* — Renaissance IP Law Group LLP

(57) ABSTRACT

An image sensor having active, peripheral and dummy regions is provided as follows. A dummy through electrode is disposed in the substrate. An active through electrode is disposed in the substrate. An insulation structure in which a color filter is embedded is disposed on the substrate. A dummy bottom electrode is disposed on the insulation structure and connected electrically to the dummy through electrode. An active bottom electrode is disposed on the insulation structure and connected electrically to the active through electrode. A photoelectric conversion layer is disposed on the insulation structure. A top electrode is disposed on the photoelectric conversion layer and the dummy bottom electrode. The top electrode is connected electrically to the dummy bottom electrode. The photoelectric conversion layer is interposed between the top electrode and the active bottom electrode which are separated from each other.

19 Claims, 10 Drawing Sheets

(56) References Cited

U.S. PATENT DOCUMENTS

| | | | |
|---|---|---|---|
| 2015/0002719 A1* | 1/2015 | Isono | H01L 27/14683 |
| | | | 348/311 |
| 2015/0115243 A1 | 4/2015 | Miyanami | |
| 2015/0255498 A1* | 9/2015 | Sugiura | H01L 27/14621 |
| | | | 257/432 |
| 2016/0043144 A1 | 2/2016 | Sato | |
| 2016/0064437 A1 | 3/2016 | Kawashima et al. | |
| 2016/0133865 A1 | 5/2016 | Yamaguchi | |
| 2016/0240571 A1 | 8/2016 | Baek | |
| 2018/0097028 A1* | 4/2018 | Kinsman | H01L 27/14621 |

* cited by examiner

IMAGE SENSOR

CROSS-REFERENCE TO RELATED APPLICATION

This application claims priority under 35 U.S.C § 119 of Korean Patent Application No. 10-2017-0007167 filed on Jan. 16, 2017 in the Korean Intellectual Property Office, the disclosure of which is hereby incorporated by reference in its entirety.

TECHNICAL FIELD

The present inventive concept relates to an image sensor.

DISCUSSION OF RELATED ART

Image sensors convert optical images into electrical signals. The image sensors may be classified into a CCD (Charge Coupled Device) type and a CMOS (Complementary Metal Oxide Semiconductor) type. A CIS (CMOS image sensor) is a short for the CMOS type image sensor. The CIS has a plurality of two-dimensionally arranged pixels. Each of the pixels includes a photodiode (PD). The photodiode converts an incident light into an electrical signal.

SUMMARY

According to an exemplary embodiment of the present inventive concept, an image sensor is provided as follows. The image sensor has an active region, a peripheral region, and a dummy region between the active region and the peripheral region. A substrate has a first surface and a second surface facing each other. A dummy through electrode is disposed in the substrate of the dummy region. An active through electrode is disposed in the substrate of the active region. An insulation structure is disposed on the second surface. A color filter is embedded in the insulation structure. A dummy bottom electrode is disposed on the insulation structure of the dummy region and connected electrically to the dummy through electrode. An active bottom electrode is disposed on the insulation structure of the active region and connected electrically to the active through electrode. A photoelectric conversion layer is disposed on the insulation structure of the active region. A top electrode is disposed on the photoelectric conversion layer and the dummy bottom electrode. The top electrode is connected electrically to the dummy bottom electrode. The photoelectric conversion layer is interposed between the top electrode and the active bottom electrode so that the top electrode and the active bottom electrode are separated from each other.

According to an exemplary embodiment of the present inventive concept, an image sensor having an active region, a peripheral region, and a dummy region between the active region and the peripheral region is provided as follows. A substrate has a first surface and a second surface facing each other. A dummy through electrode is disposed in the substrate of the dummy region. An active through electrode is disposed in the substrate of the active region. An insulation structure is disposed on the second surface. A color filter is embedded in the insulation structure. A dummy bottom electrode is disposed on the insulation structure of the dummy region and connected electrically to the dummy through electrode. An active bottom electrode is disposed on the insulation structure of the active region and connected electrically to the active through electrode. A top electrode is disposed on the insulation structure of the active region. A photoelectric conversion layer is interposed between the top electrode and the insulation structure of the active region. A light block pattern is disposed on the top electrode extending from the active region toward the dummy region so that the light block pattern is connected electrically to the dummy bottom electrode.

According to an exemplary embodiment of the present inventive concept, an image sensor is provided as follows. A substrate has a first surface and a second surface facing each other. An external pad is disposed on the second surface of the substrate. A plurality of pixel region each has a photoelectric conversion region, a first floating diffusion region and a second floating diffusion region. The first floating diffusion region and the second floating diffusion region are disposed in the substrate and adjacent to the first surface of the substrate. The photoelectric conversion region is disposed in the substrate and between the second surface of the substrate and the second floating diffusion region. An active bottom electrode is disposed on the second surface and connected electrically to the first floating diffusion region through an active connection path. A dummy bottom electrode is disposed on the second surface and connected electrically to the external pad through a dummy connection path. A top electrode is disposed on the second surface of the substrate. The top electrode covers the active bottom electrode. A photoelectric conversion layer is interposed between the top electrode and the active bottom electrode.

BRIEF DESCRIPTION OF THE DRAWINGS

These and other features of the present inventive concept will become more apparent by describing in detail exemplary embodiments thereof with reference to the accompanying drawings of which.

DETAILED DESCRIPTION OF EXEMPLARY EMBODIMENTS

Figure 1:
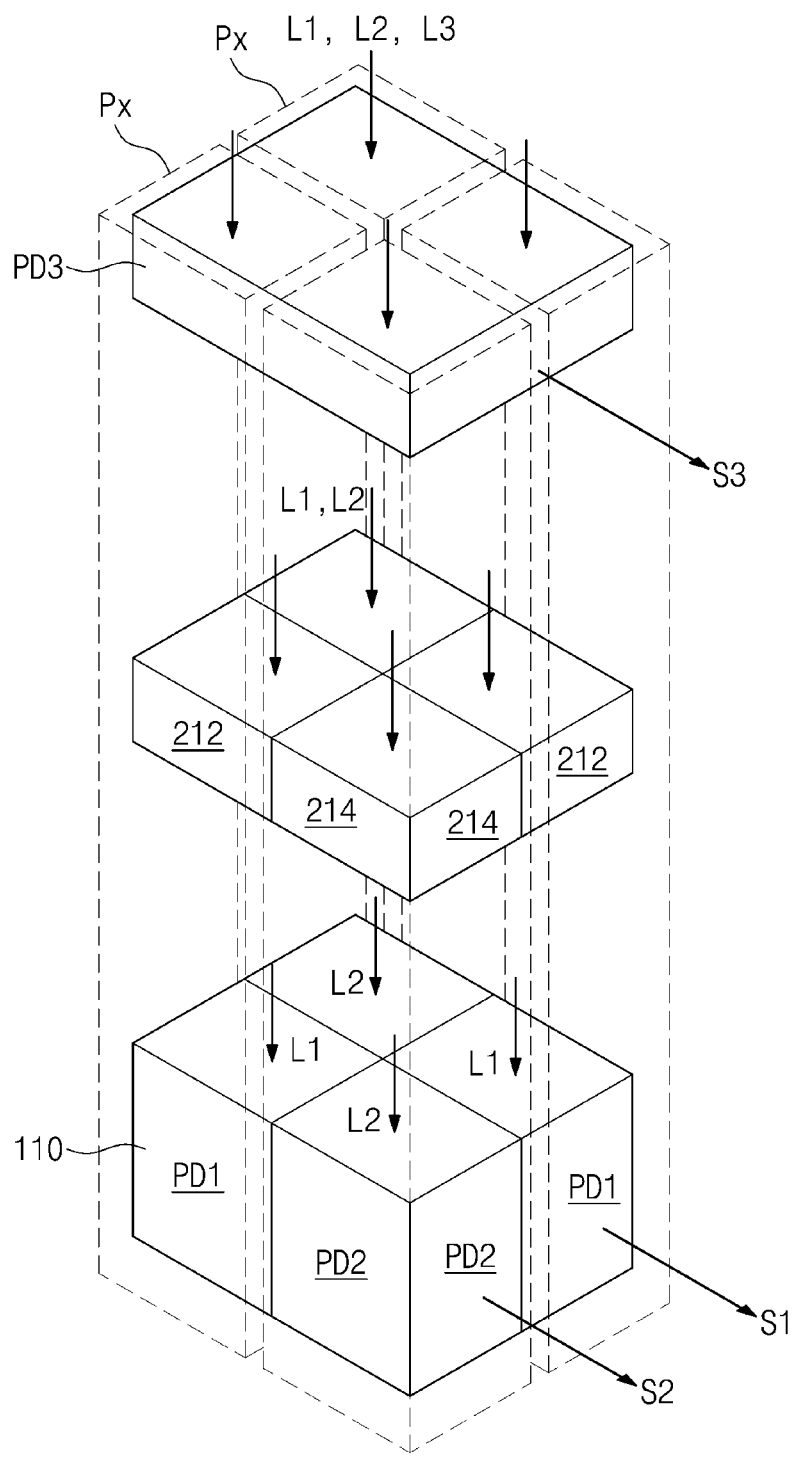
FIG. 1 is a block diagram illustrating an image sensor according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. Like reference numerals may refer to the like elements throughout the specification and drawings.

FIG. 1 is a block diagram illustrating an image sensor according to an exemplary embodiment of the present inventive concept.

Referring to FIG. 1, an image sensor may include photoelectric conversion regions PD1 and PD2, color filters 212 and 214, and a photoelectric conversion layer PD3. The photoelectric conversion regions PD1 and PD2 may be provided in a substrate 110. The photoelectric conversion layer PD3 may be provided on a surface of the substrate 110, and the color filters 212 and 214 may be provided between the photoelectric conversion layer PD3 and the substrate 110.

The photoelectric conversion layer PD3 may receive a first light L1, a second light L2 and a third light L3 respectively having a first wavelength, a second wavelength and a third wavelength. The first wavelength and the second wavelength may be different from the third wavelength. The first wavelength may be different from the second wavelength. For example, the first light L1 may correspond to a red color light, the second light L2 may correspond to a blue color light, and the third light L3 may correspond to a green color light.

The photoelectric conversion layer PD3 may absorb the third light L3 and may generate a third photoelectric signal S3 from the third light L3. The first light L1 and the second light L2 may pass through the photoelectric conversion layer PD3. The photoelectric conversion layer PD3 may be commonly shared by a plurality of pixels Px.

The lights L1 and L2 may be incident onto the color filters 212 and 214 after passing through the photoelectric conversion layer PD3. The color filters 212 and 214 may include first color filters 212 and second color filters 214. Each of the pixels Px may include one of the first color filter 212 and the second color filter 214. The first color filter 212 may pass through the first light L1 among the first light L1 and the second light L2. The second color filter 214 may pass through the second light L2 among the first light L1 and the second light L2.

The photoelectric conversion regions PD1 and PD2 may include first photoelectric conversion regions PD1 and second photoelectric conversion regions PD2. Each of the pixels Px may include one of the first and second photoelectric conversion regions PD1 and PD2. The pixel Px including the first color filter 212 may include the first photoelectric conversion region PD1. The pixel Px including the second color filter 214 may include the second photoelectric conversion region PD2. For example, the first photoelectric conversion region PD1 may be provided below the first color filter 212, and the second photoelectric conversion region PD2 may be provided below the second color filter 214.

The first color filter 212 may cause the first light L1 to be incident onto the first photoelectric conversion region PD1. The first photoelectric conversion region PD1 may generate a first photoelectric signal S1 from the first light L1. The second color filter 214 may cause the second light L2 to be incident onto the second photoelectric conversion region PD2. The second photoelectric conversion region PD2 may generate a second photoelectric signal S2 from the second light L2.

The photoelectric conversion layer PD3 may be disposed on (or above) the photoelectric conversion regions PD1 and PD2 such that an image sensor may have increased integration. For example, the photoelectric conversion layer PD3 may be stacked on the photoelectric conversion regions PD1 and PD2, and the color filters 212 and 214 may be interposed between the photoelectric conversion layer PD3 and the photoelectric conversion regions PD1 and PD2.

Hereinafter, operation of the photoelectric conversion layer PD3 will be described with reference to FIGS. 2A and 2B, and operation of the photoelectric conversion regions PD1 and PD2 will be described with reference to FIG. 2C.

Figure 2A:
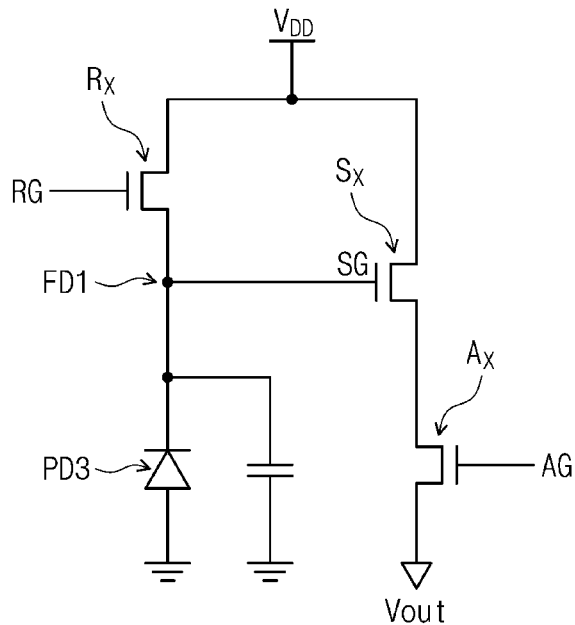
FIGS. 2A and 2B are circuit diagrams for explaining operation of a photoelectric conversion layer of an image sensor according to an exemplary embodiment of the present inventive concept.
Figure 2B:
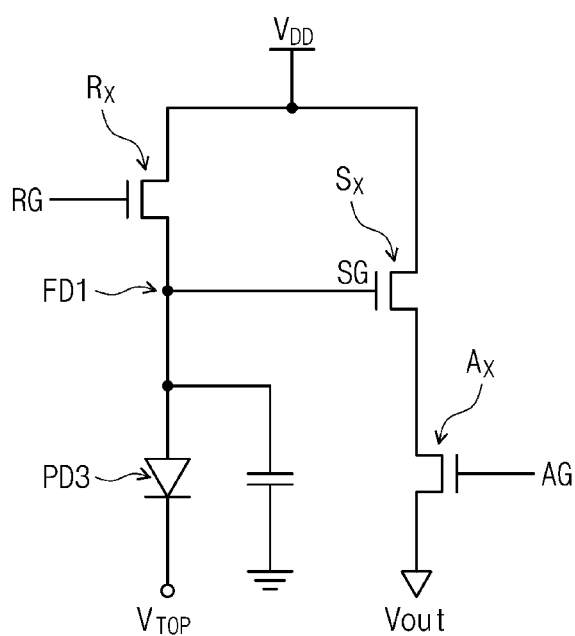

FIGS. 2A and 2B are circuit diagrams for showing operation of a photoelectric conversion layer of an image sensor according to an exemplary embodiment of the present inventive concept.

In FIGS. 2A and 2B, each of pixels may include a first source follower transistor Sx, a first reset transistor Rx, and a first selection transistor Ax. The first source follower transistor Sx, the first reset transistor Rx, and the first selection transistor Ax may respectively include a first source follower gate SG, a first reset gate RG, and a first selection gate AG.

A first floating diffusion region FD1 may function as a source of the first reset transistor Rx. The first floating diffusion region FD1 may be electrically connected to the first source follower gate SG of the first source follower transistor Sx. The first source follower transistor Sx may be electrically connected to the first selection transistor Ax.

In relation to the photoelectric conversion layer PD3, each pixel may operate as follows.

First, a power voltage $V_{DD}$ may be applied to a drain of the first reset transistor Rx and a drain of the first source follower transistor Sx in a light-blocked state and the first reset transistor Rx may be turned on. Thus, charges remaining in the first floating diffusion region FD1 may be discharged. After discharging the remaining charges from the first floating diffusion region FD1, the first reset transistor Rx may be turned off.

When an external light is incident onto the photoelectric conversion layer PD3, photo-charges (i.e., electron-hole pairs) may be generated in the photoelectric conversion layer PD3. When a voltage $V_{TOP}$ is applied to the photoelectric conversion layer PD3, the generated photo-charges may be transferred to and accumulated in the first floating diffusion region FD1. FIG. 2A illustrates a circuit diagram in the case where electrons act as the photo-charges transferred from the photoelectric conversion layer PD3 to the first floating diffusion region FD1, and FIG. 2B illustrates a circuit diagram in the case where holes act as the photo-charges transferred from the photoelectric conversion layer PD3 to the first floating diffusion region FD1. A gate bias of the first source follower transistor Sx may be changed in proportion to an amount of charges accumulated in the first floating diffusion region FD1, and this may lead to a change in source potential of the first source follower transistor Sx. If the first selection transistor Ax is turned on, an output line Vout may output signals due to the light incident onto the photoelectric conversion layer PD3.

FIG. 1 shows that a single pixel includes three transistors Rx, Sx, and Ax. The present inventive concept is not limited thereto. For example, neighboring pixels may share at least one of the first reset transistor Rx, the first source follower transistor Sx, and the first selection transistor Ax so that a degree of integration of an image sensor may increase.

Figure 2C:
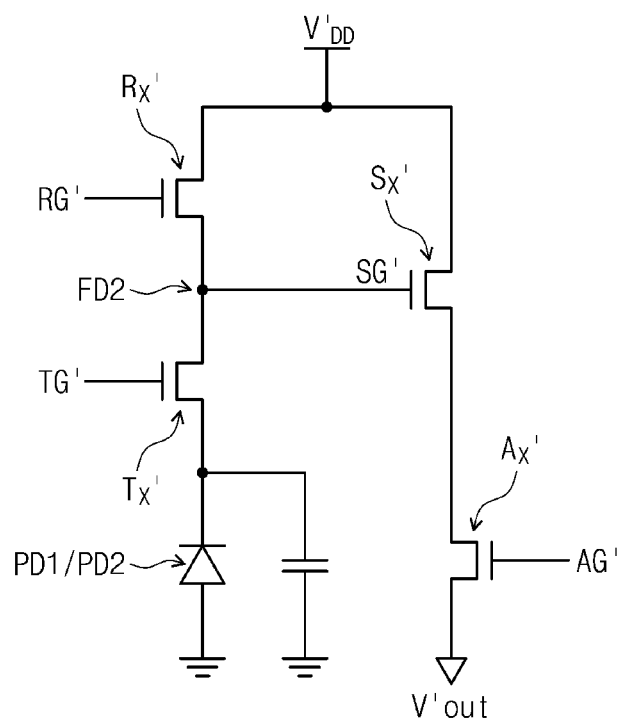
FIG. 2C is a circuit diagram for explaining operation of a photoelectric conversion region of an image sensor according to an exemplary embodiment of the present inventive concept.

FIG. 2C is a circuit diagram for showing operation of a photoelectric conversion region of an image sensor according to an exemplary embodiment of the present inventive concept.

In FIG. 2C, each of pixels may further include a transfer transistor Tx', a second source follower transistor Sx', a second reset transistor Rx', and a second selection transistor Ax'. The transfer transistor Tx', the second source follower transistor Sx', the second reset transistor Rx', and the second selection transistor Ax' may respectively include a transfer gate TG', a second source follower gate SG', a second reset gate RG', and a second selection gate AG'.

A second floating diffusion region FD2 may function as a drain of the transfer transistor Tx'. The second floating diffusion region FD2 may function as a source of the second reset transistor Rx'. The second floating diffusion region FD2 may be electrically connected to the second source follower gate SG' of the second source follower transistor Sx'. The second source follower transistor Sx' may be electrically connected to the second selection transistor Ax'.

When an external light is incident onto the photoelectric conversion regions PD1 and PD2, electron-hole pairs may be generated in the photoelectric conversion regions PD1 and PD2. The generated holes may be transferred to and accumulated in p-type impurity regions of the photoelectric conversion regions PD1 and PD2, and the generated electrons may be transferred to and accumulated in n-type impurity regions of the photoelectric conversion regions PD1 and PD2. When the transfer transistor Tx' is turned on, the generated charges (i.e., holes or electrons) may be transferred to and accumulated in the second floating diffusion region FD2.

The second source follower transistor Sx', the second reset transistor Rx', and the second selection transistor Ax' may have their operations and functions substantially the same as those of the first source follower transistor Sx, the first reset transistor Rx, and the first selection transistor Ax discussed above with reference to FIGS. 2A and 2B.

In an exemplary embodiment, the second source follower transistor Sx', the second reset transistor Rx', and the second selection transistor Ax' may be provided separately from and operated independently of the first source follower transistor Sx, the first reset transistor Rx, and the first selection transistor Ax, respectively.

In an exemplary embodiment, the photoelectric conversion regions PD1 and PD2 may share at least one of the first source follower transistor Sx, the first reset transistor Rx, and the first selection transistor Ax discussed above with reference to FIGS. 2A and 2B. In this case, at least one of the second source follower transistor Sx', the second reset transistor Rx', and the second selection transistor Ax'.

Figure 3A:
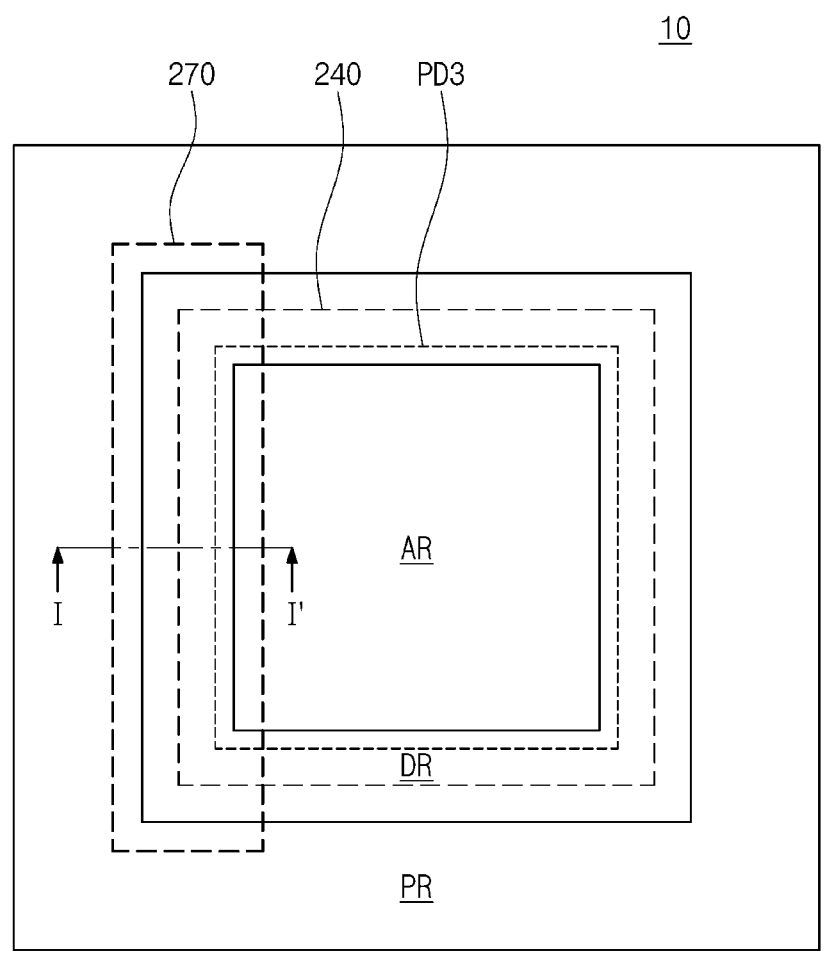
FIG. 3A is a plan view of an image sensor according to an exemplary embodiment of the present inventive concept.
Figure 3B:
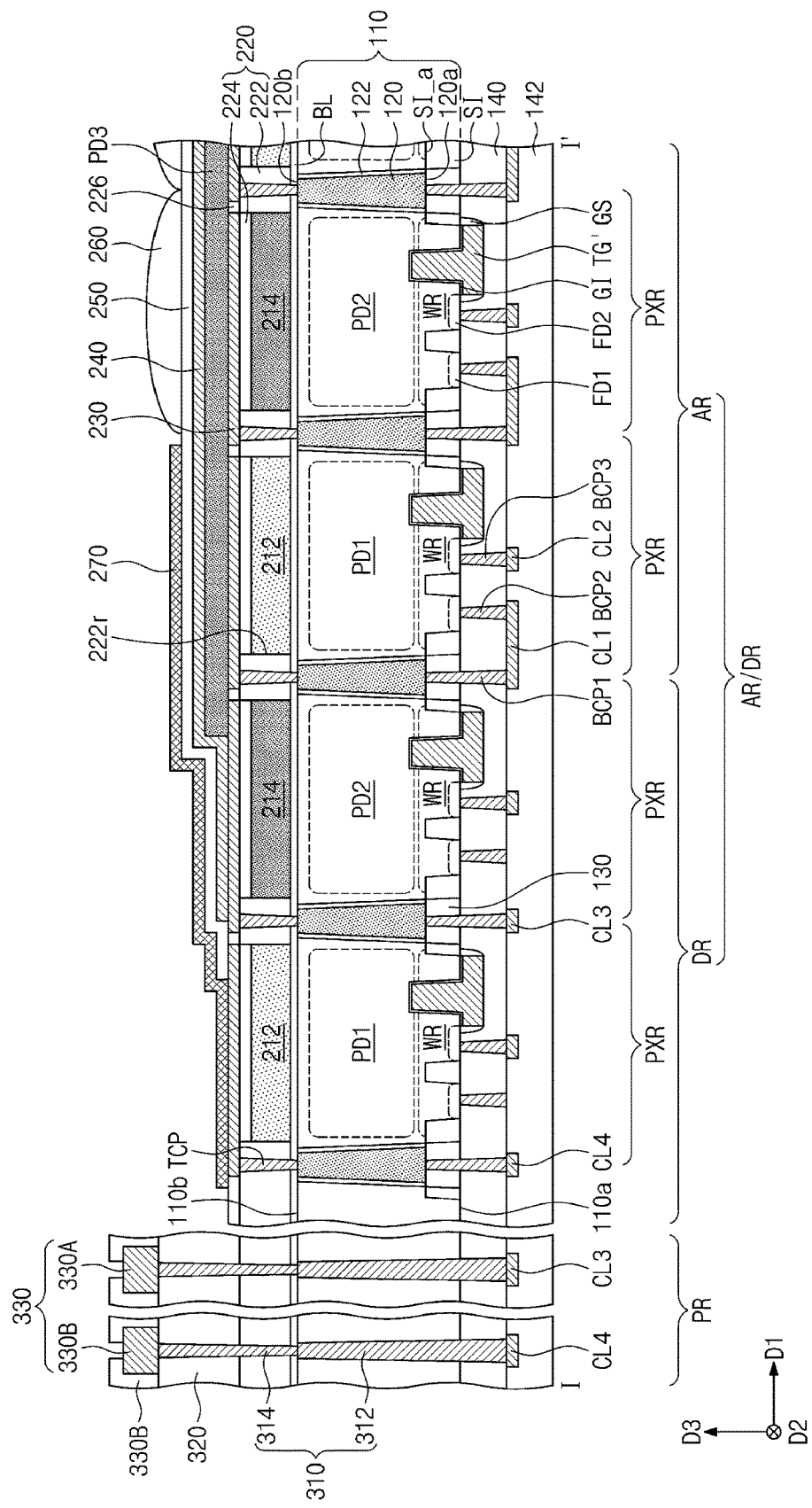
FIG. 3B is a cross-sectional view of an image sensor according to an exemplary embodiment of the present inventive concept.

FIG. 3A is a plan view of an image sensor according to an exemplary embodiment of the present inventive concept. FIG. 3B is a cross-sectional view of an image sensor according to an exemplary embodiment of the present inventive concept. For example, FIG. 3B is a cross-sectional view taken along line I-I' of FIG. 3A.

In FIGS. 3A and 3B, an image sensor 10 may include a pixel array region AR/DR and a peripheral region PR surrounding the pixel array region AR/DR. The pixel array region AR/DR, when viewed in plan, may include an active region AR and a dummy region DR surrounding the active region AR. The dummy region DR, when viewed in plan, may be positioned between the active region AR and the peripheral region PR. The active region AR may be provided thereon with active pixels, and the dummy region DR may be provided thereon with dummy pixels. The active pixels may correspond to the pixels Px of FIGS. 1 and 2A to 2C. The dummy pixel may have a similar or substantially the same structure to that of the active pixel, but need not perform the same operation (i.e., receiving light to generate photoelectric signals) as that of the active pixel. The peripheral region PR may be provided thereon with a peripheral circuit.

The image sensor 10 may include a substrate 110. The substrate 110 may extend from the active region AR toward the dummy region DR and the peripheral region PR. The substrate 110 may have a first surface 110a and a second surface 110b facing each other. The first surface 110a of the substrate 110 may be a front surface, and the second surface 110b of the substrate 110 may be a back surface. For example, the substrate 110 may be a bulk silicon substrate, a silicon-on-insulator (SOI) substrate, or a semiconductor epitaxial layer. The substrate 110 may have a first conductivity (e.g., p-type conductivity).

The substrate 110 of the active region AR and the dummy region DR may include a plurality of pixel regions PXR. For example, the pixel regions PXR may be two-dimensionally arranged along a first direction D1 and a second direction D2 intersecting each other. The substrate 110 of the peripheral region PR may include no pixel region PXR.

Through electrodes 120 may be provided in the substrate 110 of the active region AR and the dummy region DR. The through electrodes 120 formed in the active region AR may be referred to as active through electrodes; and the through electrodes 120 formed in the dummy region DR may be referred to as dummy through electrodes. The through electrodes 120 may include a conductive material. In an exemplary embodiment, the through electrodes 120 may include n-type doped polysilicon or p-type doped polysilicon. For example, the through electrodes 120 may include n-type impurities or p-type impurities of which concentration is more than about $10^{19}/cm^3$.

In FIG. 3, the through electrodes 120 may be disposed between two pixel regions PXR adjacent to each other. For example, the through electrodes 120 may be disposed between two pixel regions PXR adjacent to each other along the first direction D1. The through electrodes 120 and the pixel regions PXR may be alternately arranged along the first direction D1.

Each of the through electrodes 120 may extend along a third direction D3 substantially perpendicular to the first surface 110a of the substrate 110. Each of the through electrodes 120 may have a first end 120b coplanar with the second surface 110b of the substrate 110. For example, the first end 120b of the through electrode 120 and the second surface 100b of the substrate 100 may be at substantially the same height from the first surface 110a. In FIG. 3B, each of the through electrodes 120 may have a width that decreases upwardly from the first surface 110a toward the second surface 110b of the substrate 110.

In an exemplary embodiment, as shown in FIG. 3B, each of the through electrodes 120 may have a second end 120a at a level recessed toward the second surface 110b from the first surface 110a. For example, each of the through electrodes 120 may have a vertical length between the second end 120a and the first end 120b less than a vertical length between the first surface 110a and the second surface 110b of the substrate 110. In FIG. 3B, the first end 120b may be opposite to the second end 120a. The second end 120a of each of the through electrodes 120 may be positioned at substantially the same level as that of a floor surface SI_a of a second device isolation pattern SI which will be discussed below. The present inventive concept is not limited thereto.

For example, unlike FIG. 3B, the second end 120a of each of the through electrodes 120 may be positioned at a level closer to the second surface 110b of the substrate 110 than to the floor surface SI_a of the second device isolation pattern SI which will be discussed below. The present inventive concept is not limited thereto. For example, unlike FIG. 3B, the second end 120a of each of the through electrodes 120 may be positioned at a level closer to the first surface 110a of the substrate 110 than to the floor surface SI_a of the second device isolation pattern SI which will be discussed below.

In an exemplary embodiment, a buried insulation pattern 130 may be provided on the second end 120a of each of the through electrodes 120. The buried insulation pattern 130 may have a surface coplanar with the first surface 110a of the substrate 110. For example, the surface of the buried insulation pattern 130 and the first surface 110a of the substrate 110 may be at substantially the same height in the image sensor 10. The buried insulation pattern 130 may include, for example, silicon oxide, silicon nitride, or silicon oxynitride.

The present inventive concept is not limited thereto. For example, unlike FIG. 3B, the second end 120a of each of the through electrodes 120 may be coplanar with the first surface 110a of the substrate 110. For example, the second end 120a of the through electrode 120 and the first surface 110a of the substrate 110 may be at substantially the same height in the image sensor 10. In this case, the buried insulation pattern 130 may be omitted.

A through insulation pattern 122 may be provided between the substrate 110 and a sidewall of each of the through electrodes 120. The through insulation pattern 122 may include, for example, silicon oxide, silicon nitride, or silicon oxynitride.

In an exemplary embodiment, first device isolation patterns (not shown) may be provided in the substrate 110. Each of the first device isolation patterns may be a deep device isolation pattern extending toward the second surface 110b from the first surface 110a of the substrate 110. The first device isolation patterns may be disposed between the pixel regions PXR. The present inventive concept is not limited thereto. For example, the first device isolation patterns may be omitted.

A second device isolation pattern SI may be provided in the substrate 110. The second device isolation pattern SI may be a shallow device isolation pattern formed on the first surface 110a of the substrate 110. The second device isolation pattern SI may have a depth less than those of the first device isolation patterns.

The second device isolation pattern SI may define a device active region in each of the pixel regions PXR. The device active region may be provided for operation of transistors disposed on the first surface 110a of the substrate 110. For example, the transistors may include the transistors Rx, Sx, Ax, Tx', Rx', Sx', and Ax' discussed above with reference to FIGS. 2A to 2C. The second device isolation pattern SI may include, for example, silicon oxide, silicon nitride, or silicon oxynitride.

Photoelectric conversion regions PD1 and PD2 may be provided in the substrate 110 of the active region AR and the dummy region DR. For example, one of the photoelectric conversion regions PD1 and PD2 may be disposed in each pixel region PXR of the substrate 110. The photoelectric conversion regions PD1 and PD2 may include first photoelectric conversion regions PD1 and second photoelectric conversion regions PD2. The first photoelectric conversion regions PD1 may correspond to the first photoelectric conversion regions PD1 of FIG. 1, and the second photoelectric conversion regions PD2 may correspond to the second photoelectric conversion regions PD2 of FIG. 1. The first photoelectric conversion regions PD1 and the second photoelectric conversion regions PD2, when viewed in plan, may be alternately arranged in a two-dimensional array.

The photoelectric conversion regions PD1 and PD2 may be impurity doped regions each having a second conductivity (e.g., n-type conductivity) different from the first conductivity (e.g., p-type conductivity) of the substrate 110. The photoelectric conversion regions PD1 and PD2 may thus have the second conductivity. For example, a potential slope may be generated between the first surface 110a and the second surface 110b of the substrate 110 by forming a difference in impurity concentration in each of the photoelectric conversion regions PD1 and PD2 between the first surface 110a and the second surface 110b. For example, each of the photoelectric conversion regions PD1 and PD2 may include a plurality of impurity regions which is stacked on each other.

Well impurity regions WR may be provided in the substrate 110 of the active region AR and the dummy region DR. For example, the well impurity regions WR may be disposed in the pixel regions PXR of the substrate 110. Each of the well impurity regions WR may be adjacent to the first surface 110a of the substrate 110. Therefore, in each of the pixel regions PXR, the well impurity region WR may be positioned between the first surface 110a of the substrate 110 and one of the photoelectric conversion regions PD1 and PD2. For example, in each of the pixel regions PXR, one of the photoelectric conversion regions PD1 and PD2 may be positioned between the well impurity region WR and the second surface 110b of the substrate 110.

The well impurity regions WR may be impurity doped regions each having the first conductivity (e.g., p-type conductivity). The well impurity regions WR may thus have the first conductivity.

First floating diffusion regions FD1 and the second floating diffusion regions FD2 may be provided in the substrate 110 of the active region AR and the dummy region DR. For example, a pair of the first floating diffusion region FD1 and the second floating diffusion region FD2 may be provided in each of the pixel regions PXR of the substrate 110. Each of the first floating diffusion regions FD1 may correspond to the first floating diffusion region FD1 of FIGS. 2A and 2B, and each of the second floating diffusion regions FD2 may correspond to the second floating diffusion region FD2 of FIG. 2C.

In each of the pixel regions PXR, the pair of the first floating diffusion region FD1 and the second floating diffusion region FD2 may be positioned in the well impurity region WR and adjacent to the first surface 110a of the substrate 110. In each of the pixel regions PXR, the first floating diffusion region FD1 and the second floating diffusion region FD2 may be spaced apart from each other, and the second device isolation pattern SI may extend between the pair of the first floating diffusion region FD1 and the second floating diffusion region FD2. In each of the pixel regions PXR, the first floating diffusion region FD1 and the second floating diffusion region FD2 may be electrically separated from each other by potential barrier.

Each of the first floating diffusion region FD1 and the second floating diffusion region FD2 may be an impurity doped region having the second conductivity (e.g., n-type conductivity). The first floating diffusion region FD1 and the second floating diffusion region FD2 may thus have the second conductivity.

Transfer gates TG' may be disposed on the first surface 110a of the substrate 110 of the active region AR and the dummy region DR. Each of the transfer gates TG' may be disposed in a corresponding one of the pixel regions PXR. Each of the transfer gates TG' may be provided at its side with a corresponding one of the second floating diffusion regions FD2.

Each of the transfer gates TG' may include a lower portion inserted into the substrate 110 and an upper portion connected to the lower portion. The upper portion of the transfer gate TG' may protrude above the first surface 110a of the substrate 110. Each of the transfer gates TG' may correspond to the transfer gate TG' of FIG. 2C.

A gate dielectric pattern GI may be provided between the substrate 110 and each of the transfer gates TG'. A gate spacer GS may be provided on a sidewall of the upper portion of each transfer gate TG'. For example, each of the gate dielectric pattern GI and the gate spacer GS may include silicon oxide, silicon nitride, or silicon oxynitride.

A first source follower gate (not shown), a first reset gate (not shown), a first selection gate (not shown), a second source follower gate (not shown), a second reset gate (not shown), or a second selection gate (not shown) may be provided on the first surface 110a of the substrate 110 of the active region AR and the dummy region DR. For example, the gates may be disposed on the first surface 110a in each of the pixel regions PXR. The gates may be configured to perform substantially the same function as those discussed above with reference to FIGS. 2A to 2C.

A first interlayer dielectric layer 140 may be provided on the first surface 110a of the substrate 110. The first interlayer dielectric layer 140 may extend from the active region AR toward the dummy regions DR and the peripheral regions PR. The first interlayer dielectric layer 140 may cover the gates (e.g., the transfer gates TG') provided on the first surface 110a of the substrate 110. The first interlayer dielectric layer 140 may include, for example, silicon oxide, silicon nitride, or silicon oxynitride.

First bottom contact plugs BCP1 may be provided in the first interlayer dielectric layer 140. Each of the first bottom contact plugs BCP1 may pass through the first interlayer dielectric layer 140 to be connected to a corresponding one of the through electrodes 120. As viewed in cross-section, each of the first bottom contact plugs BCP1 may have a width less than that of each of the through electrodes 120. As viewed in cross-section, the width of each of the first bottom contact plugs BCP1 may decrease upwardly toward the through electrode 120.

Second bottom contact plugs BCP2 and third bottom contact plugs BCP3 may be provided in the first interlayer dielectric layer 140. Each of the second bottom contact plugs BCP2 may pass through the first interlayer dielectric layer 140 to be connected to a corresponding one of the first floating diffusion regions FD1, and each of the third bottom contact plugs BCP3 may pass through the first interlayer dielectric layer 140 to be connected to a corresponding one of the second floating diffusion regions FD2. Each of the second contact plugs BCP2 and the third bottom contact plugs BCP3 may have a width that decreases with approaching the first surface 110a of the substrate 110. The second contact plugs BCP2 and the third bottom contact plugs BCP3 may have substantially the same length in the third direction D3.

The first bottom contact plug BCP1, the second bottom contact plug BCP2 and the third bottom contact plug BCP3 each may include a conductive material. For example, the conductive material may include metal (e.g., tungsten).

In an exemplary embodiment, unlike FIG. 3B, the second contact plugs BCP2 and the third bottom contact plugs BCP3 may be provided only in the active region AR. For example, the second contact plugs BCP2 and the third bottom contact plugs BCP3 need not be provided on the dummy region DR.

The first bottom contact plugs BCP1 disposed in the active region AR may be referred to as first active bottom contact plugs or active bottom contact plugs; and the first bottom contact plugs BCP1 disposed in the dummy region DR may be referred to as first dummy bottom contact plugs.

When the buried insulation patterns 130 are provided like FIG. 3B, the first bottom contact plugs BCP1 may further penetrate the buried insulation patterns 130. In this case, each of the first bottom contact plugs BCP1 may have a length in the third direction D3 greater than lengths in the third direction D3 of the second bottom contacts BCP2 and the third bottom contact plugs BCP3.

In an exemplary embodiment, unlike FIG. 3B, if the buried insulation patterns 130 are omitted, each of the first bottom contact plugs BCP1 may have a length in the third direction D3 substantially the same as lengths in the third direction D3 of the second bottom contact plugs BCP2 and the third bottom contact plugs BCP3.

First connection lines CL1 may be provided on the first interlayer dielectric layer 140 of the active region AR. Each of the first connection lines CL1 may connect the first bottom contact plug BCP1 to the second bottom contact plug BCP2 adjacent to the first bottom contact plug BCP1. Each of the through electrodes 120 in the active region AR may be electrically connected to the first floating diffusion region FD1 through the first bottom contact plug BCP1, the first connection line CL1, and the second bottom contact plug BCP2. The first connection lines CL1 may be provided only on the active region AR. For example, the first connection lines CL1 may not be provided on the dummy region DR and the peripheral region PR.

Second connection lines CL2 may be provided on the first interlayer dielectric layer 140 of the active region AR and the dummy region DR. The second connection lines CL2 may be connected to a corresponding one of the third bottom contact plugs BCP3. The present inventive concept is not limited thereto. For example, the second connection lines CL2 may be provided only in the active region AR. The second connection lines CL2 need not be provided in the dummy region DR.

Third connection lines CL3 and fourth connection lines CL4 may be provided on the first interlayer dielectric layer 140 of the dummy region DR and the peripheral region PR. The third connection lines CL3 and the fourth connection lines CL4 may be connected to corresponding first bottom contact plugs BCP1 of the dummy region DR, and may thus be connected to corresponding through electrodes 120 of the dummy region DR. Each of the third and fourth connection lines CL3 and CL4 may extend from the dummy region DR toward the peripheral region PR. FIG. 3B shows cross-sectional ends of the third and fourth connection lines CL3 and CL4 extended between the dummy region DR and the peripheral region PR.

The connection lines CL1 to CL4 may include a conductive material. For example, the connection lines CL1 to CL4 may include metal (e.g., tungsten).

A second interlayer dielectric layer 142 may be provided on the first interlayer dielectric layer 140. The second interlayer dielectric layer 142 may extend from the active region AR toward the dummy region DR and the peripheral region PR. The second interlayer dielectric layer 142 may cover the connection lines CL1 to CL4. The second interlayer dielectric layer 142 may include, for example, silicon oxide, silicon nitride, or silicon oxynitride.

A buffer layer BL may be provided on the second surface 110b of the substrate 110. The buffer layer BL may extend from the active region AR toward the dummy region DR and the peripheral region PR. The buffer layer BL may prevent the photoelectric conversion regions PD1 and PD2 from receiving charge (i.e., electron or hole) originating from a defect on the second surface 110b of the substrate 110. The buffer layer BL may include metal oxide. For example, the buffer layer BL may include aluminum oxide or hafnium oxide.

An insulation structure 220 may be provided on the buffer layer BL. The insulation structure 220 may extend from the active region AR toward the dummy region DR and the peripheral region PR. Color filters 211 and 214 may be embedded in the insulation structure 220 of the active region AR and the dummy region DR. The insulation structure 220 may include, for example, silicon oxide, silicon nitride, or silicon oxynitride.

For example, the insulation structure 220 may include a first insulation pattern 222 having recesses 222r that are provided in the active region AR and the dummy region DR. The recesses 222r of the first insulation pattern 222, when viewed in plan, may correspond to the pixel regions PXR of the substrate 110. The recesses 222r may expose the buffer layer BL.

The color filters 212 and 214 may include first color filters 212 and second color filters 214. The first color filters 212 may correspond to the first color filters 212 of FIG. 1, and the second color filters 214 may correspond to the second color filters 214 of FIG. 1. One of the color filters 212 and 214 may be disposed in each of the recesses 222r. The first color filters 212, when viewed in plan, may be disposed to correspond to the first photoelectric conversion regions PD1. For example, the first color filters 212 and the first photoelectric conversion regions PD1 may overlap vertically. The second color filters 214, when viewed in plan, may be disposed to correspond to the second photoelectric conversion regions PD2. For example, the second color filters 214 and the second photoelectric conversion regions PD2 may overlap vertically.

As discussed with reference to FIGS. 1 and 2C, the first color filter 212 may allow the first light L1 to pass through. The first photoelectric conversion region PD1 may generate charges (i.e., electron-hole pairs) from the first light L1. When the transfer transistor Tx' is turned on, the generated charges (i.e., holes or electrons) may be transferred to and accumulated in the second floating diffusion region FD2. The second color filter 214 may allow the second light L2 to pass through. The second photoelectric conversion region PD2 may generate charges (i.e., electron-hole pairs) from the second light L2. When the transfer transistor Tx' is turned on, the generated charges (i.e., holes or electrons) may be transferred to and accumulated in the second floating diffusion region FD2.

The present inventive concept is not limited thereto. For example, unlike FIG. 3B, the color filters 212 and 214 may be provided only in the active region AR. The color filters 212 and 214 need not be provided in the dummy region DR.

The insulation structure 220 may further include second insulation patterns 224 provided on the color filters 212 and 214. In an exemplary embodiment, as shown in FIG. 3B, the second insulation patterns 224 may be provided in corresponding recesses 222r and spaced apart from each other. The present inventive concept is not limited thereto. For example, unlike FIG. 3B, the second insulation patterns 224 may extend onto the first insulation pattern 222 and may be connected to each other.

Top contact plugs TCP may be provided in the first insulation pattern 222 of the active region AR and the dummy region DR. Each of the top contact plugs TCP may penetrate the buffer layer BL and the first insulation pattern 222 to be connected to a corresponding one of the through electrodes 120. When viewed in cross-section, each of the top contact plugs TCP may have a width less than that of each of the through electrodes 120. When viewed in cross-section, the width of each of the top contact plugs TCP may decrease with approaching the through electrode 120. The top contact plugs TCP may include a conductive material. For example, the top contact plugs TCP may include metal (e.g., tungsten). The top contact plugs TCP provided in the active region AR may be referred to as active top contact plugs; and the top contact plugs TCP provided in the dummy region DR may be referred to as dummy top contact plugs.

Bottom electrodes 230 may be provided on the insulation structure 220 of the active region AR and the dummy region DR. When viewed in plan, the bottom electrodes 230 may be disposed to correspond to the pixel regions PXR of the substrate 110 and spaced apart from each other. Each of the bottom electrodes 230 may be connected to its corresponding one of the top contact plugs TCP. The bottom electrodes 230 provided in the active region AR may be referred to as active bottom electrodes; and the bottom electrodes 230 provided in the dummy region DR may be referred to as dummy bottom electrodes.

In the active region AR, each of the bottom electrodes 230 may be electrically connected to the first floating diffusion region FD1 through the top contact plug TCP, the through electrode 120, the first bottom contact plug BCP1, the first connection line CL1, and the second bottom contact plug BCP2.

In the dummy region DR, each of the bottom electrodes 230 may be electrically connected to one of the third connection lines CL3 and the fourth connection lines CL4 through the top contact plug TCP, the through electrode 120, and the first bottom contact plug BCP1.

The bottom electrodes 230 may include a transparent conductive material. For example, the bottom electrodes 230 may include ITO (Indium Tin Oxide), IZO (Indium Zinc Oxide), ZnO (Zinc Oxide), or an organic transparent conductive material.

A third insulation pattern 226 may be provided to fill a gap between the bottom electrodes 230. The third insulation pattern 226 may have a top surface substantially coplanar with those of the bottom electrodes 230. For example, the top surface of the third insulation pattern 226 and the top surfaces of the bottom electrodes 230 may be at substantially the same height from the second surface 110b of the substrate 110. The third insulation pattern 226 may include, for example, silicon oxide, silicon nitride, or silicon oxynitride.

A photoelectric conversion layer PD3 may be provided on the bottom electrodes 230 of the active region AR. As shown in FIG. 3A, when viewed in cross-section, the photoelectric conversion layer PD3 may cover the active region AR and expose the peripheral region PR and at least a portion of the dummy region DR. The photoelectric conversion layer PD3 may expose at least some of the bottom electrodes 230 of the dummy region DR. The present inventive concept is not limited thereto. For example, unlike FIG. 3A, the photoelectric conversion layer PD3 may be provided only on the bottom electrodes 230 of the active region AR, without overlapping the bottom electrodes 230 of the dummy region DR. For example, unlike FIG. 3A, the photoelectric conversion layer PD3 may be provided on the bottom electrodes 230 of the active region AR, completely covering at least one of the bottom electrodes 230 of the dummy region DR.

In an exemplary embodiment, the photoelectric conversion layer PD3 may include an organic photoelectric conversion layer. For example, the photoelectric conversion layer PD3 may be an organic photodiode including a p-type organic semiconductor material and an n-type organic semiconductor material. The photodiode may be formed of a p-n junction between the p-type organic semiconductor material and the n-type organic semiconductor material. In an exemplary embodiment, the photoelectric conversion layer PD3 may include quantum dots or chalcogenide.

The photoelectric conversion layer PD3 may correspond to the photoelectric conversion layer PD3 of FIGS. 1, 2A, and 2B. As discussed with reference to FIG. 1, the photoelectric conversion layer PD3 may absorb the third light L3 to generate charges (e.g., electron-hole pairs) from the third light L3. The generated charges may be transferred to the first floating diffusion region FD1 through the bottom electrode 230, the top contact plug TCP, the through electrode 120, the first bottom contact plug BCP1, the first connection line CL1, and the second bottom contact plug BCP2 and may be accumulated in the floating diffusion region FD1.

A top electrode 240 may be provided on the photoelectric conversion layer PD3. The top electrode 240 may extend from the active region AR onto the dummy region DR and thus be connected to at least one of the bottom electrodes 230 of the dummy region DR. As shown in FIG. 3A, the top electrode 240 may cover the photoelectric conversion layer PD3. As shown in FIG. 3B, the top electrode 240 may cover at least one of sidewalls of the photoelectric conversion layer PD3.

In an exemplary embodiment, as shown in FIGS. 3A and 3B, the top electrode 240 may be electrically connected to some of the bottom electrodes 230 of the dummy region DR but need not be connected to the other of the bottom electrodes 230 of the dummy region DR. For example, the top electrode 240 may be in contact with the some of the bottom electrodes 230 of the dummy region DR but need not be in contact with the other of the bottom electrodes 230 of the dummy region DR.

In this case, the top electrode 240 may expose the other of the bottom electrodes 230 of the dummy region DR. The top electrode 240 may have a planar area greater than that of the photoelectric conversion layer PD3 and less than that of the pixel array region AR/DR.

In the dummy region DR adjacent to the active region AR, the top electrode 240 may be electrically connected to the third connection line CL3 through the bottom electrode 230, the top contact plug TCP, the through electrode 120, and the first bottom contact plug BCP1.

The top electrode 240 may include a transparent conductive material. For example, the top electrodes 240 may include ITO (Indium Tin Oxide), IZO (Indium Zinc Oxide), ZnO (Zinc Oxide), or an organic transparent conductive material.

A capping layer 250 may be provided on the top electrode 240. The capping layer 250 may extend from the active region AR onto the dummy region DR. The capping layer 250 may cover the top electrode 240 and expose at least some of the bottom electrodes 230 of the dummy region DR. The capping layer 250 may include an insulating material. For example, the capping layer 250 may include aluminum oxide, silicon oxide, silicon nitride, or silicon oxynitride.

A light block pattern 270 may be provided on the capping layer 250 of the active region AR. The light block pattern 270 may vertically overlap the pixel regions PXR positioned at an edge of the active region AR. The light block pattern 270 may prevent light from being incident onto the pixel regions PXR positioned at the edge of the active region AR. The light block pattern 270 may include, for example, metal.

The light block pattern 270 may extend toward its adjacent dummy region DR. The light block pattern 270 may extend to cover a sidewall of the photoelectric conversion layer PD3 and a sidewall of the capping layer 250.

In an exemplary embodiment, as shown in FIGS. 3A and 3B, the light block pattern 270 may be connected to the bottom electrodes 230 of the dummy region DR that are exposed by the capping layer 250. For example, the light block pattern 270 may be in contact with the bottom electrodes 230 of the dummy region DR that are exposed through the capping layer 250.

In the dummy region DR, the light block pattern 270 may be electrically connected to the fourth connection line CL4 through the bottom electrode 230, the top contact plug TCP, the through electrode 120, and the first bottom contact plug BCP1.

Micro-lenses 260 may be provided on the capping layer 250 of the active region AR. When viewed in cross-section, the micro-lenses 260 may be disposed to correspond to the pixel regions PXR of the active region AR. Each of the micro-lenses 260 may have a convex shape and a predetermined curvature radius. No micro-lenses 260 may be provided in the pixel regions PXR of the active region AR that are covered with the light block pattern 270.

A peripheral insulation layer 320 may be provided on the insulation structure 220 of the peripheral region PR. The peripheral insulation layer 320 may include, for example, silicon oxide, silicon nitride, or silicon oxynitride.

External pads 330 and a protective insulation layer 340 may be provided on the peripheral insulation layer 320 of the peripheral region PR. An external electrical signal may be input into the external pads 330, or an internal signal generated in the image sensor 10 may be output to the external through the external pads 330. The protective insulation layer 340 may be disposed on the external pads 330 and may include openings each of which at least partially exposes the external pad 330. The external pads 330 may include a first external pad 330A that is connected electrically to the bottom electrode 230 of the dummy region DR and a second external pad 330B that is connected electrically to the light block pattern 270.

Peripheral contact structures 310 may be provided in the peripheral region. The peripheral contact structures 310 may electrically connect the third connection lines CL3 and the fourth connection lines CL4 to their corresponding external pads 330. Each of the peripheral contact structures 310 may penetrate the substrate 110, the first interlayer dielectric layer 140, the buffer layer BL, the insulation structure 220, and the peripheral insulation layer 320.

In an exemplary embodiment, as shown in FIG. 3B, each of the peripheral contact structures 310 may include a bottom peripheral contact 312 and a top peripheral contact 314. The bottom peripheral contact 312 may penetrate the substrate 110 and the first interlayer dielectric layer 140. The top peripheral contact 314 may penetrate the peripheral insulation layer 320, the insulation structure 220, and the buffer layer BL. The present inventive concept, however, is not limited thereto.

The top electrode 240 may be electrically connected to the external pad 330 through the bottom electrode 230 of the dummy region DR, the top contact plug TCP of the dummy region DR, the through electrode 120 of the dummy region DR, the first bottom contact plug BCP1 of the dummy region DR, the third connection line CL3, and the peripheral contact structure 310. An operating voltage may be applied from the external pad 330 to the top electrode 240. The third connection line CL3 of the dummy region may be electrically connected to the third connection line CL3 of the peripheral region PR.

The light block pattern 270 may be electrically connected to the external pad 330 through the bottom electrode 230 of the dummy region DR, the top contact plug TCP of the dummy region DR, the through electrode 120 of the dummy region DR, the first bottom contact plug BCP1 of the dummy region DR, the fourth connection line CL4, and the peripheral contact structure 310. A ground voltage may be applied from the external pad 330 to the light block pattern 270. The fourth connection line CL4 of the dummy region DR may be electrically connected to the fourth connection line CL4 of the peripheral region PR.

According to an exemplary embodiment of the present inventive concept, an electrical connection may be established between the top electrode 240 and the external pad 330 through dummy pixel structures provided in the dummy region DR (i.e., the bottom electrode 230, the top contact plug TCP, the through electrode 120, and the first bottom contact plug BCP1 that are provided on the dummy region DR) and the third connection line CL3 provided on the first surface 110a of the substrate 110. The third connection line CL3 of the peripheral region PR may be extended to the dummy region DR. For example, the third connection line CL3 of the peripheral region PR may be electrically connected to the third connection line CL3 of the dummy region DR. The dummy pixel structures may be formed simultaneously with active pixel structures (i.e., the bottom electrode 230, the top contact plug TCP, the through electrode 120, and the first bottom contact plug BCP1 that are provided on the active region AR), and the third connection line CL3 may be formed simultaneously with the first and second connection lines CL1 and CL2. Therefore, according to an exemplary embodiment of the present inventive concept, the top electrode 240 may be electrically connected to the external pad 330 without performing an additional process step of forming connection structures on the second surface 110b of the substrate 110.

According to an exemplary embodiment of the present inventive concept, an electrical connection may be established between the light block pattern 270 and the external pad 330 through the dummy pixel structures provided on the dummy region DR and the fourth connection line CL4 provided on the first surface 110a of the substrate 110. The fourth connection line CL4 of the peripheral region PR may be extended to the dummy region DR. For example, the fourth connection line CL4 of the peripheral region PR may be electrically connected to the fourth connection line CL4 of the dummy region DR. The dummy pixel structures may be formed together with the active pixel structures, and the fourth connection line CL4 may be formed together with the first and second connection lines CL1 and CL2. Therefore, according to an exemplary embodiment of the present inventive concept, the top electrode 240 may be electrically connected to the external pad 330 without performing an additional process step of forming connection structures on the second surface 110b of the substrate 110.

According to an exemplary embodiment, the bottom electrode 230 of the active region AR may be connected to the first floating diffusion region FD1 through an active connection path. The active connection path may include the top contact plug TCP of the active region AR, the through electrode 120 of the active region AR, the first bottom contact plug BCP1 of the active region AR, the connection line CL1 and the second bottom contact plug BCP2 of the active region AR. The top contact plug TCP of the active region AR, the through electrode 120 of the active region AR, the first bottom contact plug BCP1 of the active region AR, the first connection line CL1 and the second bottom contact plug BCP2 of the active region AR may be connected electrically in series to each other in the listed order. The first connection line CL1 may be referred to as an active connection line.

According to an exemplary embodiment, the top electrode 240 may be connected to the first external pad 330A through a first dummy connection path. The first dummy connection path may include the top contact plug TCP of the dummy region DR, the through electrode 120 of the dummy region DR, the first bottom contact plug BCP1 of the dummy region DR, the third connection line CL3 and the peripheral contact structure 310 of the peripheral region PR. The top contact plug TCP of the dummy region DR, the through electrode 120 of the dummy region DR, the first bottom contact plug BCP1 of the dummy region DR, the third connection line CL3 and the peripheral contact structure 310 of the peripheral region PR may be connected electrically in series to each other in the listed order. The third connection line CL3 may be referred to as a first dummy connection line.

According to an exemplary embodiment, the light block pattern 270 may be connected to the second external pad 330B through a second dummy connection path. The second dummy connection path may include the top contact plug TCP of the dummy region DR, the through electrode 120 of the dummy region DR, the first bottom contact plug BCP1 of the dummy region DR, the fourth connection line CL4 and the peripheral contact structure 310 of the peripheral region PR. The top contact plug TCP of the dummy region DR, the through electrode 120 of the dummy region DR, the first bottom contact plug BCP1 of the dummy region DR, the fourth connection line CL4 and the peripheral contact structure 310 of the peripheral region PR may be connected electrically in series to each other in the listed order. The fourth connection line CL4 may be referred to as a second dummy connection line.

According to an exemplary embodiment, as shown in FIG. 3B, the photoelectric conversion layer PD3 may overlap the through electrode 120 of the active region AR and the first connection line CL1, and the photoelectric conversion layer PD3 may be non-overlapped with the through electrode 120 of the dummy region DR.

According to an exemplary embodiment of the present inventive concept, an image sensor may have connection structures connecting the external pads 330 to elements of the active region such as the top electrode 240 and the light block pattern 270 formed in a simplified manner.

Figure 4A:
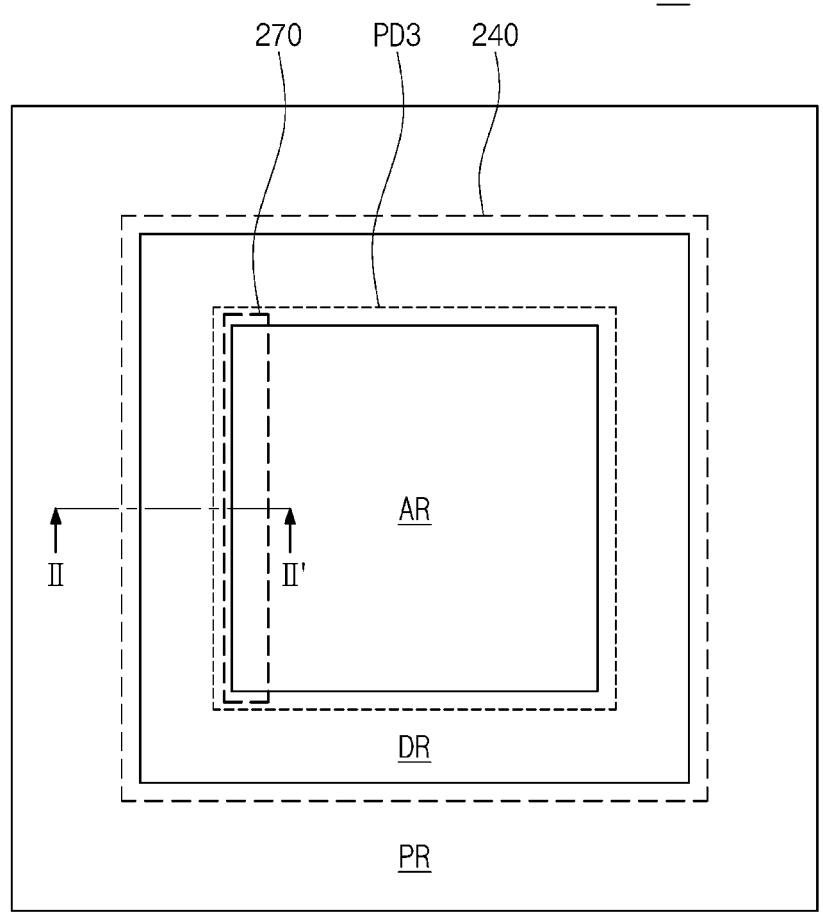
FIG. 4A is a plan view of an image sensor according to an exemplary embodiment of the present inventive concept.
Figure 4B:
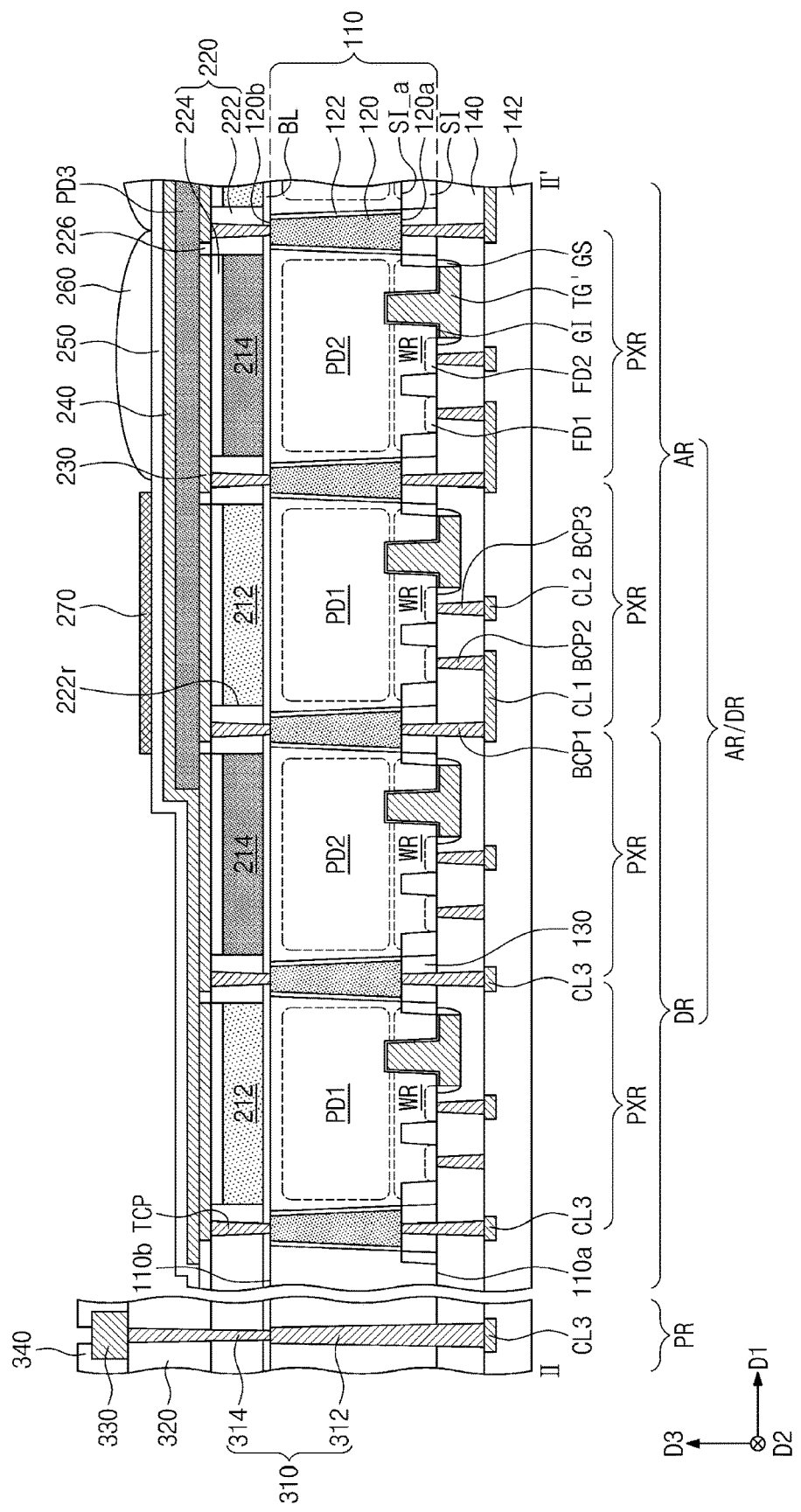
FIG. 4B is a cross-sectional view of an image sensor according to an exemplary embodiment of the present inventive concept.

FIG. 4A is a plan view of an image sensor according to an exemplary embodiment of the present inventive concept. FIG. 4B is a cross-sectional view of an image sensor according to an exemplary embodiment of the present inventive concept. In detail, FIG. 4B is a cross-sectional view taken along line II-II' of FIG. 4A. Like reference numerals in FIGS. 4A and 4B and FIGS. 3A and 3B may refer to the like elements, and a repetitive description thereof will be omitted. Hereinafter, the top electrode 240 and the light block pattern 270 will be described in detail.

Referring to FIGS. 4A and 4B, an image sensor 11 may include the pixel array region AR/DR and the peripheral region PR surrounding the pixel array region AR/DR. The pixel array region AR/DR may include the active region AR and the dummy region DR surrounding the active region AR.

The top electrode 240 may be provided on the photoelectric conversion layer PD3. The top electrode 240 may extend from the active region AR onto the dummy region DR. The top electrode 240 may be connected to the bottom electrodes 230 of the dummy region DR. For example, the top electrode 240 may be in contact with the bottom electrodes 230 of the dummy region DR.

In an exemplary embodiment, as shown in FIG. 4A, the top electrode 240 may cover the pixel array region AR/DR. The top electrode 240 may have a planar area greater than that of the pixel array region AR/DR.

The top electrode 240 may be electrically connected to the third connection line CL3 through the bottom electrode 230, the top contact plug TCP, the through electrode 120, and the first bottom contact plug BCP1 that are provided in the dummy region DR, as described with reference to FIG. 3B.

The light block pattern 270 may be provided on the capping layer 250 of the active region AR. The light block pattern 270 may be disposed to vertically overlap the pixel regions PXR positioned at an edge of the active region AR. The light block pattern 270 may prevent light from being incident onto the pixel regions PXR positioned at the edge of the active region AR.

The light block pattern 270 need not extend toward the dummy region DR. The light block pattern 270 may be in a floating state, and the image sensor 11 may have no fourth connection line CL4 discussed with reference to FIGS. 3A and 3B.

Figure 5A:
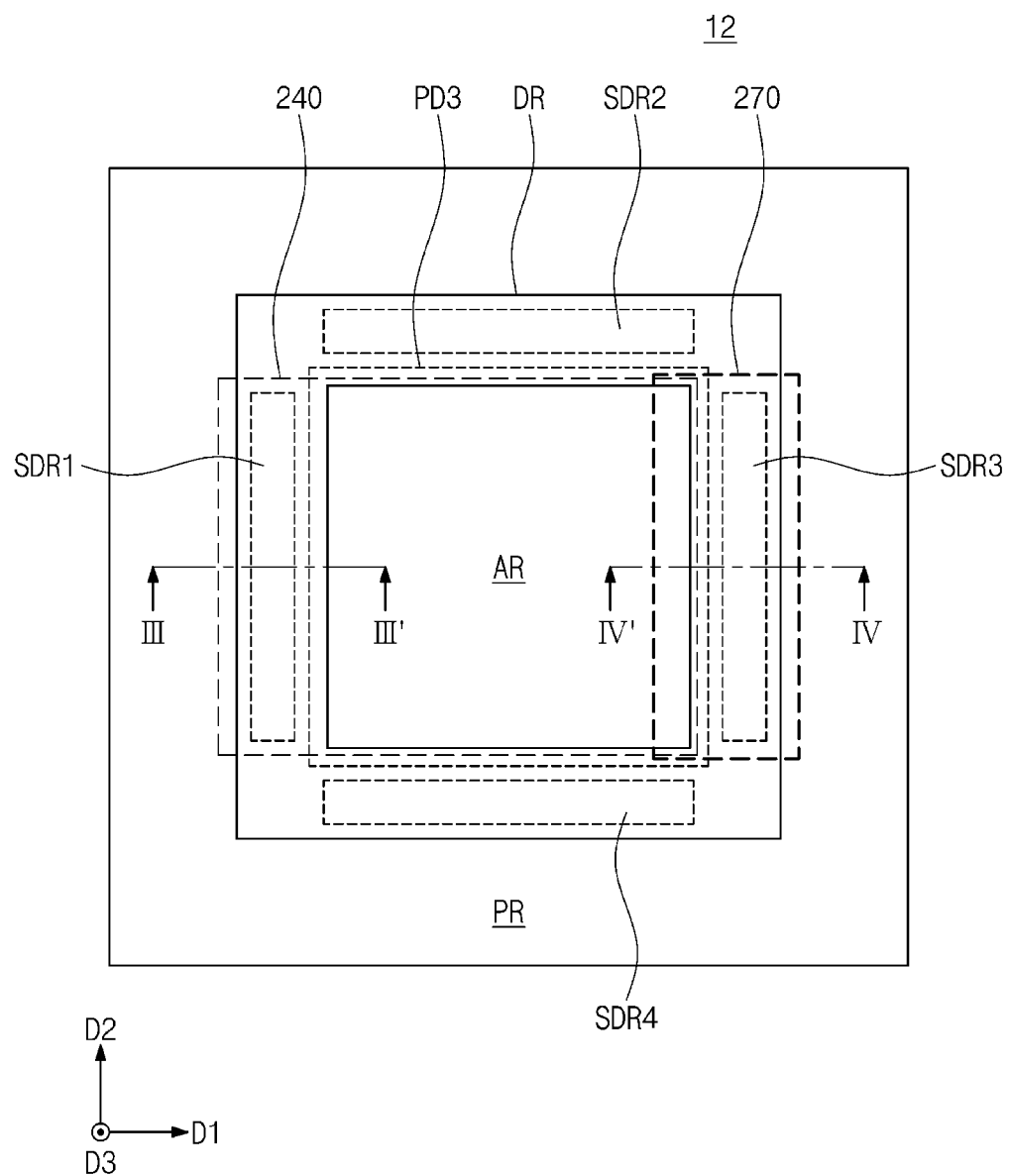
FIG. 5A is a plan view of an image sensor according to an exemplary embodiment of the present inventive concept.
Figure 5B:
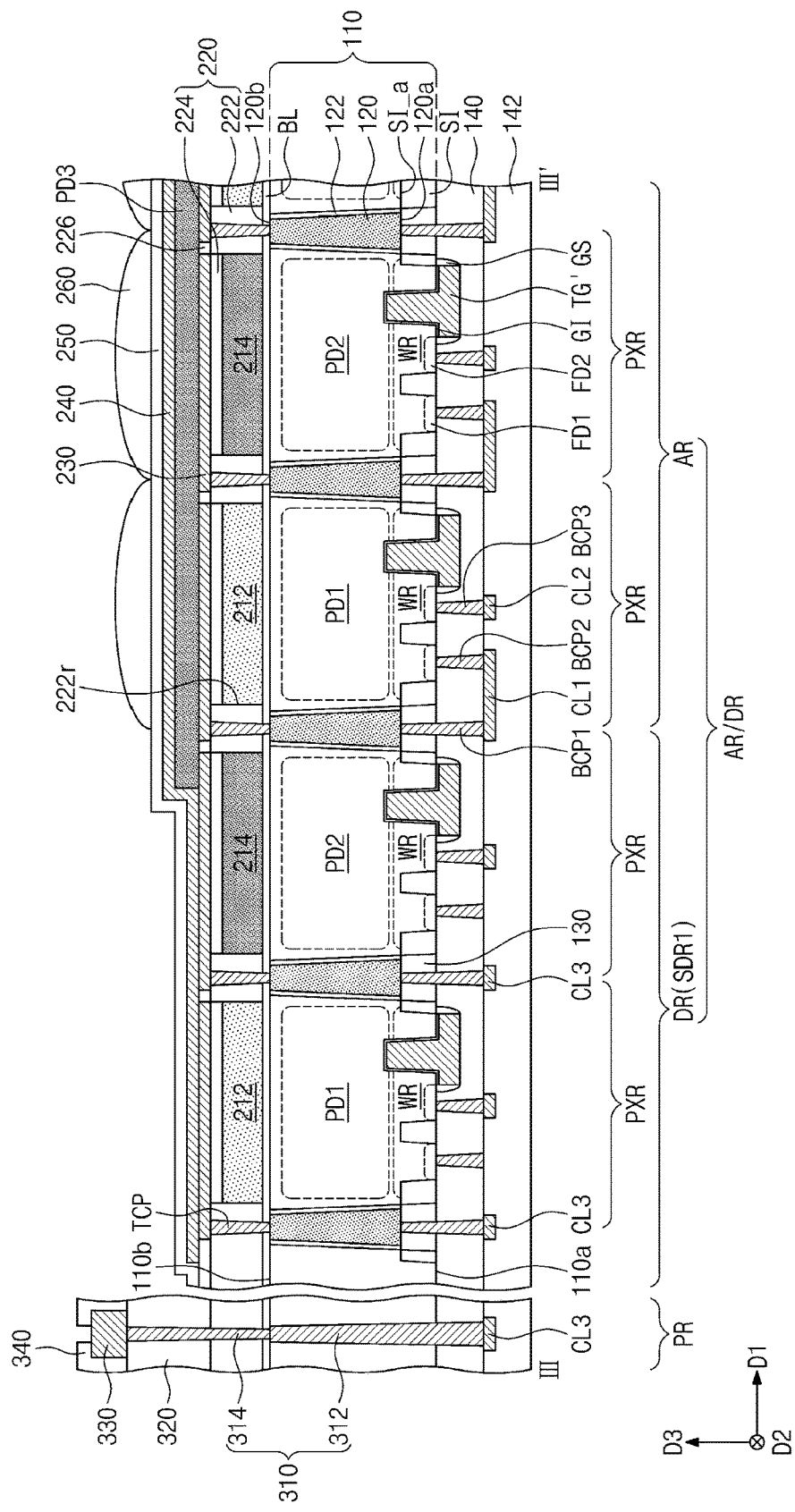
FIGS. 5B and 5C are cross-sectional views of an image sensor according to an exemplary embodiment of the present inventive concept.
Figure 5C:
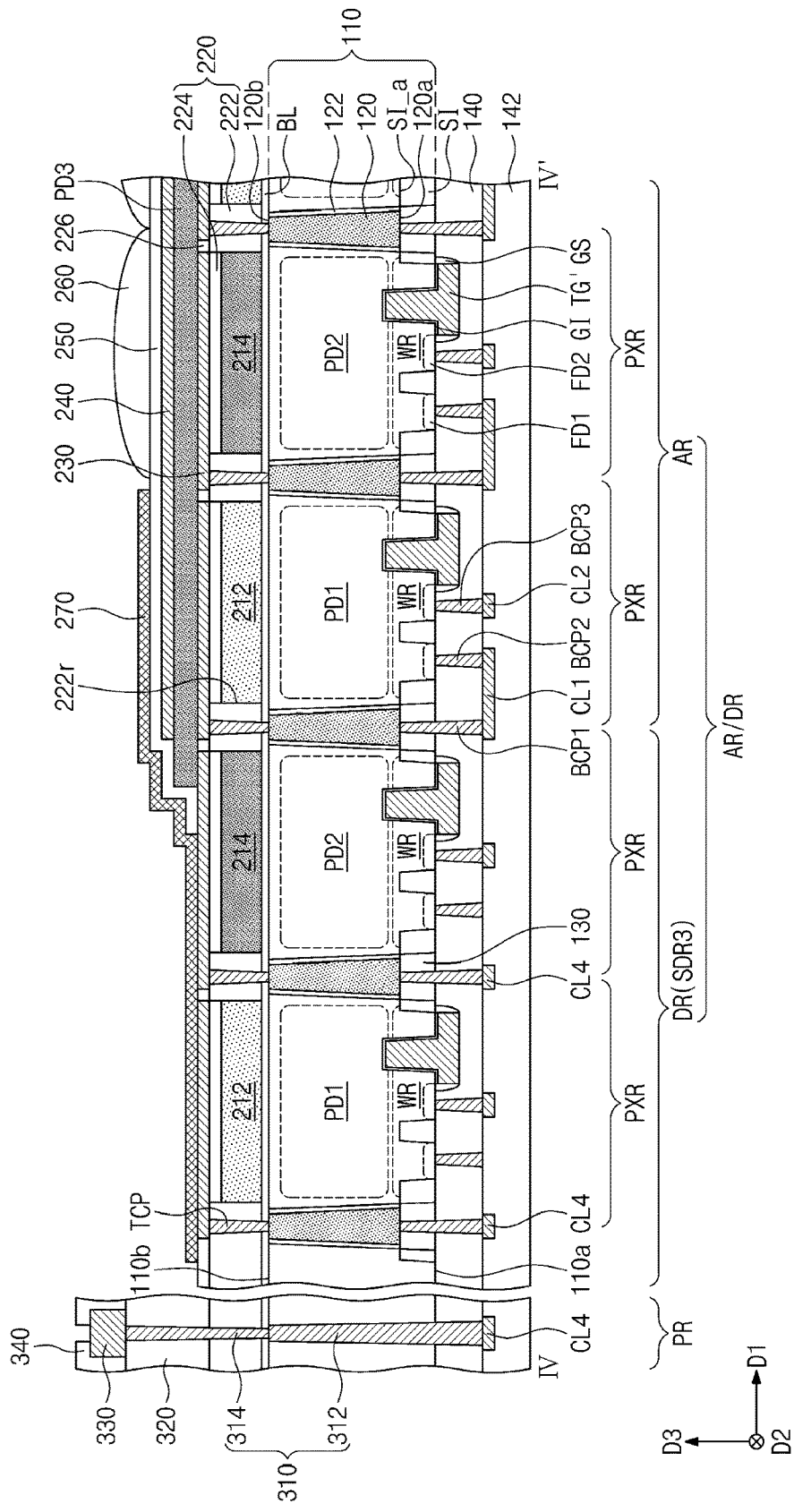

FIG. 5A is a plan view of an image sensor according to an exemplary embodiment of the present inventive concept. FIGS. 5B and 5C are cross-sectional views of an image sensor according to an exemplary embodiment of the present inventive concept. In detail, FIG. 5B is a cross-sectional view taken along line of FIG. 5A, and FIG. 5C is a cross-sectional view taken along line IV-IV' of FIG. 5A. Like reference numerals in FIGS. 5A to 5C and FIGS. 3A and 3B may refer to the like elements, and a repetitive description thereof will be omitted. Hereinafter, the top electrode 240 and the light block pattern 270 will be described in detail.

Referring to FIGS. 5A to 5C, an image sensor 12 may include the pixel array region AR/DR and the peripheral region PR surrounding the pixel array region AR/DR. The pixel array region AR/DR may include the active region AR and the dummy region DR surrounding the active region AR.

The active region AR, when viewed in plan, may have a quadrilateral shape, and the dummy region DR may include a first sub-dummy region SDR1, a second sub-dummy region SDR2, a third sub-dummy region SDR3, and a fourth sub-dummy region SDR4 adjacent to corresponding sides of the active region AR.

The top electrode 240 may be provided on the photoelectric conversion layer PD3. The top electrode 240 may extend from the active region AR onto the dummy region DR and may be connected to at least one of the bottom electrodes 230 of the dummy region DR.

In an exemplary embodiment, as shown in FIGS. 5A and 5B, the top electrode 240 may extend onto the first sub-dummy region SDR1 adjacent to one side of the active region AR. The top electrode 240 may be electrically connected to the third connection line CL3 through the bottom electrode 230, the top contact plug TCP, the through electrode 120, and the first bottom contact plug BCP1 that are provided in the first sub-dummy region SDR1.

In this case, the top electrode 240 may expose the second sub-dummy region SDR2, the third sub-dummy region SDR3 and the fourth sub-dummy region SDR4 adjacent to other sides of the active region AR, and thus expose the bottom electrodes 230 provided in the second sub-dummy region SDR2, the third sub-dummy region SDR3 and the fourth sub-dummy region SDR4.

The light block pattern 270 may be provided on the capping layer 250 of the active region AR. The light block pattern 270 may be disposed to vertically overlap the pixel regions PXR positioned at an edge of the active region AR. The light block pattern 270 may prevent light from being incident onto the pixel regions PXR positioned at the edge of the active region AR.

In an exemplary embodiment, as shown in FIGS. 5A and 5C, the light block pattern 270 may extend from the active region AR onto the third sub-dummy region SDR3 adjacent to the active region AR. The light block pattern 270 may be electrically connected to the fourth connection line CL4 through the bottom electrode 230, the top contact plug TCP, the through electrode 120, and the first bottom contact plug BCP1 that are provided in the third sub-dummy region SDR3.

In FIG. 5A, the top electrode 240 may extend from the active region AR onto the first sub-dummy region SDR1, and the light block pattern 270 may extend from the active region AR onto the third sub-dummy region SDR3 facing the first sub-dummy region SDR1. The present inventive concept, however, is not limited thereto, and thus the top electrode 240 and the light block pattern 270 may be variously changed in their extending directions and shapes. For example, the top electrode 240 may extend onto at least one of the first sub-dummy region SDR1, the second sub-dummy region SDR2, the third sub-dummy region SDR3 and the fourth sub-dummy region SDR4. In addition, the light block pattern 270 may extend onto at least one of the first sub-dummy region SDR1, the second sub-dummy region SDR2, the third sub-dummy region SDR3 and the fourth sub-dummy region SDR4.

According to an exemplary embodiment of the present inventive concept, an electrical connection may be established between the top electrode and the external pad through the dummy pixel structures provided in the dummy region and the third connection line provided on the first surface of the substrate. The dummy pixel structures may be formed together with the active pixel structures, and the third connection line may be formed together with the first and second connection lines. Therefore, according to an exemplary embodiment of the present inventive concept, the top electrode may be electrically connected to the external pad without performing an additional process step of forming separate connection structures on the second surface of the substrate.

According to an exemplary embodiment of the present inventive concept, an electrical connection may be established between the light block pattern and the external pad through the dummy pixel structures provided in the dummy region and the fourth connection line provided on the first surface of the substrate. The dummy pixel structures may be formed together with the active pixel structures, and the fourth connection line may be formed together with the first and second connection lines. Therefore, according to an exemplary embodiment of the present inventive concept, the top electrode may be electrically connected to the external pad without performing an additional process step of forming separate connection structures on the second surface of the substrate.

According to an exemplary embodiment of the present inventive concept, an image sensor may have connection structures connecting the external pads 330 to elements of the active region such as the top electrode 240 and the light block pattern 270 formed in a simplified manner.

While the present inventive concept has been shown and described with reference to exemplary embodiments thereof, it will be apparent to those of ordinary skill in the art that various changes in form and detail may be made therein without departing from the spirit and scope of the present invention as defined by the following claims.

What is claimed is:

1. An image sensor having an active region, a peripheral region, and a dummy region between the active region and the peripheral region, the image sensor comprising:
   a substrate having a first surface and a second surface facing each other;
   a dummy through electrode in the substrate of the dummy region;
   an active through electrode in the substrate of the active region;
   an insulation structure on the second surface;
   a color filter embedded in the insulation structure;
   a dummy bottom electrode disposed on the insulation structure of the dummy region and connected electrically to the dummy through electrode;
   an active bottom electrode disposed on the insulation structure of the active region and connected electrically to the active through electrode;
   a photoelectric conversion layer disposed on the insulation structure of the active region; and
   a top electrode disposed on the photoelectric conversion layer and the dummy bottom electrode,
   wherein the top electrode is in direct contact with the dummy bottom electrode on the dummy region,
   wherein the photoelectric conversion layer is interposed between the top electrode and the active bottom electrode that are separated from each other,
   wherein the photoelectric conversion layer covers the active bottom electrode, exposing the dummy bottom electrode, and
   wherein the dummy through electrode is disposed between the photoelectric conversion layer and the peripheral region.

2. The image sensor of claim 1,
   wherein the top electrode covers a sidewall of the photoelectric conversion layer.

3. The image sensor of claim 1,
   wherein the top electrode is in contact with at least a portion of the dummy bottom electrode.

4. The image sensor of claim 1, further comprising:
   an external pad disposed on the second surface of the peripheral region; and
   a connection line disposed on the first surface,
   wherein the connection line extends from the dummy region to the peripheral region, and
   wherein the dummy through electrode and the external pad are electrically connected to each other through the connection line.

5. The image sensor of claim 4, further comprising:
   an interlayer dielectric layer disposed between the second surface and the connection line; and
   a dummy bottom contact plug penetrating the interlayer dielectric layer and connecting the dummy through electrode to the connection line.

6. The image sensor of claim 1, further comprising:
   a photoelectric conversion region in the substrate.

7. The image sensor of claim 1, further comprising:
   a first floating diffusion region disposed in the substrate of the active region and adjacent to the first surface,
   wherein the first floating diffusion region is electrically connected to the active bottom electrode through the active through electrode; and
   a second floating diffusion region disposed in the substrate of the active region and adjacent to the first surface, and
   wherein the active bottom electrode is disposed between the insulation structure of the active region and the photoelectric conversion layer.

8. The image sensor of claim 1, further comprising:
   a capping layer covering the top electrode; and
   a light block pattern on the capping layer,
   wherein the dummy bottom electrode comprises a first dummy bottom electrode and a second dummy bottom electrode spaced apart from each other,
   wherein the top electrode is connected to the first dummy bottom electrode, and
   wherein the light block pattern extends from the active region toward the dummy region so that the light block pattern is connected electrically to the second dummy bottom electrode.

9. The image sensor of claim 8, further comprising:
   a dummy top contact plug penetrating the insulation structure of the dummy region and connecting the dummy bottom electrode to the dummy through electrode,
   wherein the dummy through electrode comprises a first dummy through electrode and a second dummy through electrode,
   wherein the dummy top contact plug comprises a first dummy top contact plug and a second dummy top contact plug,
   wherein the first dummy top contact plug connects the first dummy bottom electrode to the first dummy through electrode, and
   wherein the second dummy top contact plug connects the second dummy bottom electrode to the second dummy through electrode.

10. An image sensor having an active region, a peripheral region, and a dummy region between the active region and the peripheral region, the image sensor comprising:
    a substrate having a first surface and a second surface facing each other;
    a dummy through electrode disposed in the substrate of the dummy region;
    an active through electrode disposed in the substrate of the active region;
    an insulation structure disposed on the second surface;
    a color filter embedded in the insulation structure;
    a dummy bottom electrode disposed on the insulation structure of the dummy region and connected electrically to the dummy through electrode;
    an active bottom electrode disposed on the insulation structure of the active region and connected electrically to the active through electrode;
    a top electrode disposed on the insulation structure of the active region;

a photoelectric conversion layer interposed between the top electrode and the insulation structure of the active region; and
a light block pattern disposed on the top electrode extending from the active region toward the dummy region so that the light block pattern is connected electrically to the dummy bottom electrode.

11. The image sensor of claim 10, further comprising:
a dummy top contact plug penetrating the insulation structure of the dummy region and connecting electrically the dummy bottom electrode to the dummy through electrode.

12. The image sensor of claim 10,
wherein the photoelectric conversion layer and the top electrode partially expose the dummy bottom electrode.

13. The image sensor of claim 12,
wherein the light block pattern covers a sidewall of the photoelectric conversion layer and a sidewall of the top electrode.

14. The image sensor of claim 10, further comprising:
an external pad on the second surface of the peripheral region; and
a connection line disposed on the first surface and extended from the dummy region to the peripheral region,
wherein the dummy through electrode and the external pad are connected electrically to each other through the connection line.

15. An image sensor, comprising:
a substrate having a first surface and a second surface facing each other;
an external pad disposed on the second surface of the substrate;
a plurality of pixel regions, each of the plurality of pixel regions having a photoelectric conversion region, a first floating diffusion region and a second floating diffusion region,
wherein the first floating diffusion region and the second floating diffusion region are disposed in the substrate and adjacent to the first surface of the substrate, and
wherein the photoelectric conversion region is disposed in the substrate and between the second surface of the substrate and the second floating diffusion region;
an active bottom electrode disposed on the second surface and connected electrically to the first floating diffusion region through an active connection path;
a dummy bottom electrode disposed on the second surface and connected electrically to the external pad through a dummy connection path;
a top electrode disposed on the second surface of the substrate,
wherein the top electrode covers the active bottom electrode; and
a photoelectric conversion layer interposed between the top electrode and the active bottom electrode.

16. The image sensor of claim 15,
wherein the active connection path includes an active through electrode disposed in the substrate and an active connection line disposed on the first surface of the substrate, and
wherein the dummy connection path includes a dummy through electrode disposed in the substrate and a dummy connection line disposed on the first surface of the substrate.

17. The image sensor of claim 16,
wherein the photoelectric conversion layer overlaps the active through electrode and the active connection line, and
wherein the photoelectric conversion layer is non-overlapped with the dummy through electrode.

18. The image sensor of claim 15,
wherein the photoelectric conversion layer and the photoelectric conversion region overlap each other, and
wherein the photoelectric conversion layer is formed of an organic photodiode.

19. The image sensor of claim 15,
wherein the top electrode is in contact with a sidewall of the photoelectric conversion layer and a portion of the dummy bottom electrode.

* * * * *